United States Patent
Adachi

(10) Patent No.: US 7,442,038 B2
(45) Date of Patent: Oct. 28, 2008

(54) HEAT TREATMENT JIG FOR SEMICONDUCTOR SILICON SUBSTRATE

(75) Inventor: Naoshi Adachi, Saga (JP)

(73) Assignee: Sumitomo Mitsubishi Silicaon Corporation, Tokyo (JP)

( * ) Notice: Subject to any disclaimer, the term of this patent is extended or adjusted under 35 U.S.C. 154(b) by 0 days.

(21) Appl. No.: 11/463,993

(22) Filed: Aug. 11, 2006

(65) Prior Publication Data

US 2007/0087299 A1    Apr. 19, 2007

Related U.S. Application Data

(63) Continuation of application No. 10/771,225, filed on Feb. 2, 2004, now Pat. No. 7,163,393.

(51) Int. Cl.
    *F27D 5/00* (2006.01)
(52) U.S. Cl. ............... 432/259; 432/258; 211/41.18
(58) Field of Classification Search ............ 432/5, 432/239, 249, 253, 258, 259; 211/41.18
    See application file for complete search history.

(56) References Cited

U.S. PATENT DOCUMENTS

| | | | |
|---|---|---|---|
| 2,233,434 A | | 3/1941 | Smith |
| 2,273,475 A | * | 2/1942 | Schreiber ............ 432/259 |
| 5,669,513 A | | 9/1997 | Oh et al. |
| 5,718,574 A | * | 2/1998 | Shimazu ............ 432/253 |
| 5,820,367 A | | 10/1998 | Osawa |
| 6,375,749 B1 | * | 4/2002 | Boydston et al. ........ 118/728 |
| 6,474,987 B1 | * | 11/2002 | Nakai et al. ............ 432/258 |
| 6,544,340 B2 | * | 4/2003 | Yudovsky ............ 118/728 |
| 6,576,064 B2 | | 6/2003 | Griffiths et al. |
| 6,962,477 B2 | | 11/2005 | Tateyama et al. |
| 7,163,393 B2 | * | 1/2007 | Adachi ............ 432/253 |
| 7,217,395 B2 | * | 5/2007 | Sander ............ 422/100 |
| 7,311,779 B2 | * | 12/2007 | Nguyen et al. ........ 118/52 |
| 2003/0170583 A1 | | 9/2003 | Nakashima et al. |
| 2006/0180084 A1 | * | 8/2006 | Blomiley et al. ........ 118/725 |

FOREIGN PATENT DOCUMENTS

| | | |
|---|---|---|
| JP | 05-152228 A1 | 6/1993 |
| JP | 06-151347 A1 | 5/1994 |
| JP | 2001-060559 A1 | 3/2001 |
| JP | 2001-102318 A1 | 4/2001 |
| JP | 2003-37112 A1 | 2/2003 |

OTHER PUBLICATIONS

Patent Abstracts of Japan for JP06-151347 published on May 31, 1994.

(Continued)

*Primary Examiner*—Gregory A Wilson
(74) *Attorney, Agent, or Firm*—Darby & Darby P.C.

(57) ABSTRACT

This invention provides a heat treatment jig for semiconductor silicon substrates, which, in respective heat treatment of hydrogen annealing or argon annealing, can handle enlargement of the diameter of wafers to be treated and can also prevent slipping and dislocations that occur as a result of the stress caused by the weight of the wafer itself or the deflection of the heat treatment jig itself.

1 Claim, 7 Drawing Sheets

OTHER PUBLICATIONS

Patent Abstracts of Japan for JP2001-102318 published on Apr. 13, 2001.
Patent Abstracts of Japan for JP2001-060559 published on Mar. 6, 2001.
Patent Abstracts of Japan for JP05-152228 published on Jun. 18, 1993.
Patent Abstracts of Japan for JP2003-037112 published on Feb. 7, 2003.

* cited by examiner

PRIOR ART

HEAT TREATMENT JIG FOR SEMICONDUCTOR SILICON SUBSTRATE

This application is a continuation of U.S. patent application Ser. No. 10/771,225 filed Feb. 2, 2004. The contents of the parent application are incorporated herein by reference in their entirety.

FIELD OF THE INVENTION

The present invention relates to an improvement of a heat treatment jig for heat treating semiconductor silicon substrates, and more particularly to a heat treatment jig for a semiconductor silicon substrate in which slipping and dislocation can be reduced by combining a central projecting part which supports the central portion of the silicon substrate, and circular-arc parts which are disposed concentrically with this central projecting part.

By comprising one or more circular-arc parts on the heat treatment jig and providing a central projecting part, which is at least as high as or slightly lower than the circular-arc parts, on a position corresponding to the central portion of the silicon substrate, substrate contact at the central projecting part can be reliably achieved, and a structure, in which the stress caused by the weight of the substrate itself can be more efficiently dispersed along with a contact at the circular-arc parts, can be obtained. Consequently, the object can be achieved, and the tweezers that transfer and load the silicon substrate onto the heat treatment furnace can be applied as is.

DESCRIPTION OF THE RELATED ART

Silicon single-crystal substrates used in the manufacture of today's semiconductor devices are mainly manufactured by the Czokralsky method (CZ method).

Furthermore, in device processes, there has been a trend toward progressively lower temperatures and higher degrees of integration, and it has become clear that low-density grown-in defects formed during crystal growth, which were not a problem in the past, have begun to affect device characteristics. Accordingly, epitaxial wafers that are free of grown-in defects, or wafers that are heat-treated at a high temperature in a specified atmosphere, e.g. hydrogen annealing and argon annealing are used in such device processes.

In the case of such heat treatments, a heat treatment jig carrying the wafer to be treated is inserted into (and later removed from) a furnace, or the wafer that is to be treated is mounted on such a jig disposed inside a furnace, and is later removed. In such cases, the transfer of the silicon substrate is generally accomplished by a method in which the silicon substrate is placed on a thin rectangular plate called "tweezers", and is conveyed from a conveying carrier to the jig, or from the jig to such a conveying carrier.

For example, in the case of a vertical heat treatment furnace, a transfer method has been employed in which the wafer boat used for the treatment furnace has numerous wafer holding grooves cut along the longitudinal direction of a plurality of supporting columns, and silicon substrates or the edge parts of disk-like jigs which carry these silicon substrates are supported by being inserted into these grooves (see, Japanese Patent Application Laid-Open No. 5-152228).

In this transfer method, a transfer jig construction is employed in which a so-called horseshoe-shaped carrying jig (in which a part corresponding to the range of movement of the abovementioned tweezers is cut out from a disk-like jig) is used, or in which circular-arc-form jigs with a narrow width are inserted into the abovementioned holding grooves, and silicon wafers are carried on these narrow jigs (see, Japanese Patent Application Laid-Open No. 6-151347).

Problems to be Solved by the Invention

In the case of the abovementioned respective heat treatment of hydrogen annealing or argon annealing, a high-temperature heat treatment at a temperature of 1100° C. or higher is necessary, so that the problem of crystal defects, for example, such as slipping and dislocations, arise as a result of the stress caused by the weight of the wafer itself in the heat treatment process as the diameter of the wafer being treated increases.

Furthermore, in the case of the abovementioned horseshoe type heat treatment jig shown in FIG. 1A, which has a structure that allows the passage of the tweezers for transferring the silicon substrate, the deflection of the heat treatment jig itself becomes noticeable, so that the problem of conspicuous slipping arises.

Accordingly, heat treatment wafer boats which have a ring structure have been proposed for the purpose of reducing the stress caused by the weight of such increased-diameter substrates themselves (Japanese Patent Application Laid-Open No. 2001-102318, and Japanese Patent Application Laid-Open No. 2001-060559).

As is shown in FIG. 1B, the abovementioned heat treatment jigs that have a ring structure have one ideal structure that takes into account the reduction of the stress caused by the weight of the substrates themselves. In actuality, however, in the holding of the substrates by contact with the ring as a whole, the problem of the local occurrence of slipping and dislocations in the regions of contact with the ring part of the jig occurs in the silicon substrates following heat treatment, as a result of problems in the machining precision of the jig and other jig formation problems.

Furthermore, since such jigs have a complete ring structure, the silicon substrates cannot be loaded and unloaded using an automated transfer method that employs the abovementioned tweezers, so that an extensive modification of the heat treatment furnace is required.

It is an object of the present invention to provide a heat treatment jig for a semiconductor silicon substrate which can handle the increased diameter of wafers being treated, and which can prevent slipping and dislocations that occur as a result of the stress caused by the weight of the wafer itself, the deflection of the heat treatment jig itself in various high-temperature heat treatments such as hydrogen annealing and argon annealing.

Means Used to Solve the Problems

The present inventor conducted diligent research concerning the constructions of heat treatment jigs that make it possible to prevent slipping and dislocations. As a result, the inventor made the following discovery: namely, if one or more circular-arc parts are disposed on the heat treatment jig, and a central projecting part, which is at least as high as or slightly lower than the circular-arc parts, is disposed in a position corresponding to the central portion of the silicon substrate, substrate contact by this central projecting part can be reliably achieved; furthermore, in combination with the contact by the circular-arc parts, a structure, in which the stress caused by the weight of the substrate itself can be more efficiently dispersed, is obtained, so that the abovementioned object can be achieved, and so that tweezers that transfer the silicon substrate into the heat treatment furnace can at the same time be applied "as is".

Furthermore, as a result of further research for the purpose of allowing automated transfer by means of tweezers, the inventor made the following discovery: namely, if a groove part is formed in the plate-like heat treatment jig in the radial direction from the vicinity of the central projecting part, transfer tweezers can be moved into and out of the space between the jig and the silicon substrates carried on the jig, and the jig can maintain a complete circular plate shape, so that deformation of the type that is a problem in conventional horseshoe-shaped structures can be prevented, and an effect in reducing the occurrence of slipping can also be manifested.

Furthermore, as a result of diligent research concerning the problem of the occurrence of slipping even in cases where a conventional jig with a ring structure is used, the inventor made the following discovery: generally, in the case of silicon carbide jig manufacturing processes, the main method used is a method in which a carbon matrix material is machined to a desired shape, and silicon carbide is then deposited on top of the carbon matrix material by a chemical deposition method (CVD method). In this case, however, fine projections ranging in size from several microns to several tens of microns grow on the surface in the manufacturing stage, so that slipping occurs in the silicon wafer that contacts these regions.

Accordingly, as a result of conducting various types of research on the occurrence of the abovementioned slipping, the inventor discovered that slipping can be reduced, and that deformation in a high-temperature heat treatment can be prevented utilizing a conventional silicon supporting jig that uses silicon carbide or a ceramic with a high strength at high temperatures, by using separate capping jigs on the heat treatment jig that supports the backside of the silicon substrate, or by depositing a coating film on at least the surfaces of the heat treatment jig itself that contact the silicon substrate. This discovery led to the perfection of the present invention.

EXPLANATION OF SYMBOLS

Figure 1A:
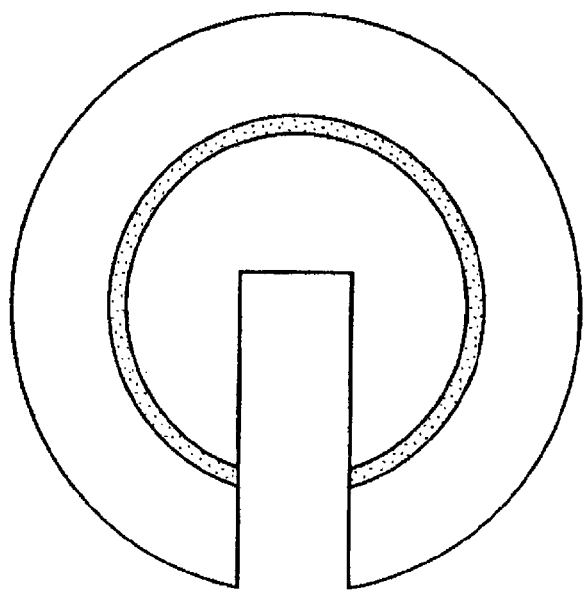
FIG. 1A shows a conventional horseshoe-shaped jig.

T Tweezers
w Silicon substrate
1, 10, 11, 12, 13 Heat treatment jigs
2 Central projecting part
3, 4, 3a, 3b, 3c, 3d, 4a, 4b, 4c, 4d Circular-arc parts
5 step-like groove part
20, 21, 22, 23 Capping members
30 Coating film

DETAILED DESCRIPTION OF THE INVENTION

As shown in FIG. 2, the present invention is characterized as follows: namely, in a disk-like heat treatment jig 1 that can support a silicon substrate, a central projecting part 2 for supporting the central portion of the backside of the substrate, and at least one circular-arc part 3 for supporting the backside of this substrate, are disposed, for example, in a concentric-circular configuration.

In the present invention, the central projecting part can reduce the downward deflection that occurs in the central portion of the silicon substrate as a result of the stress caused by the weight of the substrate itself when the substrate is supported by the one or more circular-arc part(s) disposed on the plate-like heat treatment jig. Furthermore, the central projecting part can also alleviate the concentration of stress at the edges of the circular-arc part(s), so that slipping and dislocations can be reduced.

Furthermore, even in cases where circular-arc parts are disposed doubly, it is not necessary that the inside circular arc part(s) be disposed in close proximity to the center of the substrate. Accordingly, the circular-arc parts can be disposed on the jig so that the substrate can be supported more uniformly and with a wider contact area. Furthermore, in regard to the construction of the central projecting part, since there is a high probability of contact with abnormal growth portions of the SiC during the manufacture of the SiC, it is desirable that this part have a structure in which the contact area with the substrate is minimized.

In the present invention, a construction may be used in which the circular-arc parts are a plurality of circular-arc parts that are disposed on the same circle, a plurality of circular-arc parts that are disposed on concentric circles of different radii, or a combination of both types of circular-arc parts.

Figure 2A:
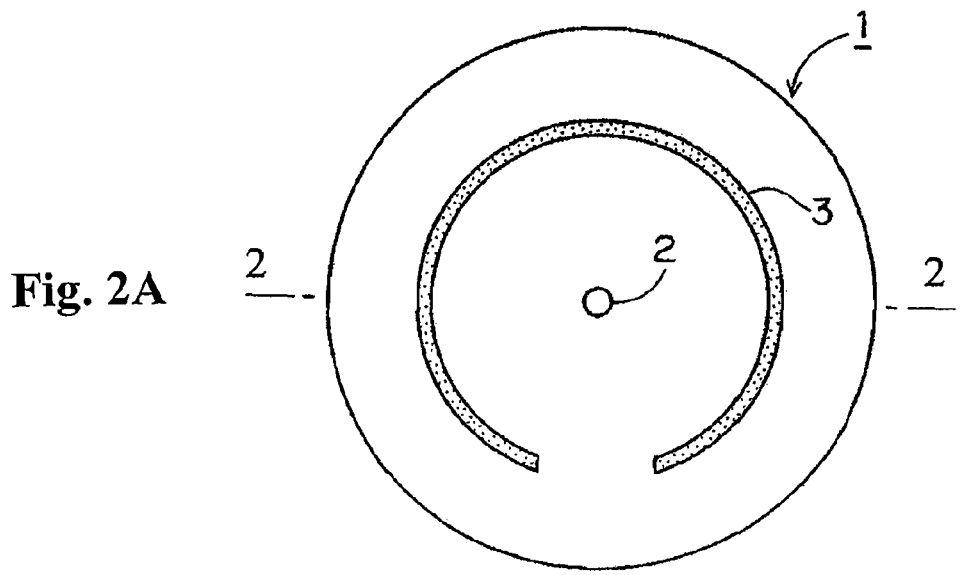
FIG. 2A is a plan view of one heat treatment jig of the present invention.
Figure 2B:
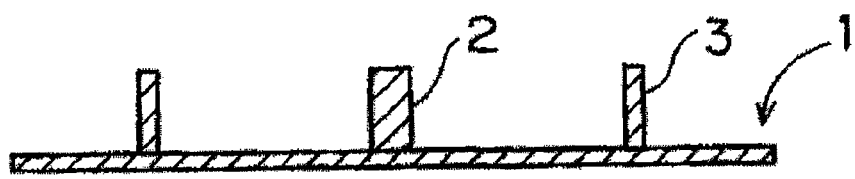
FIG. 2B is a sectional view along line 2-2 in FIG. 2A.
Figure 2C:
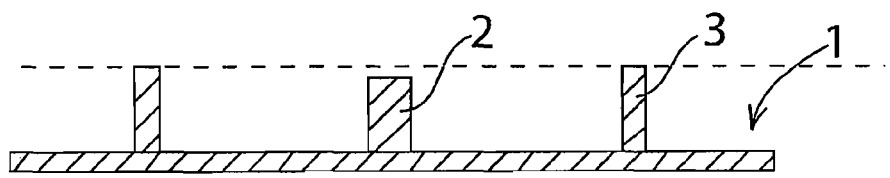
FIG. 2C is a sectional view of a different embodiment of the heat treatment jig of the present invention, cut along a line equivalent to line 2-2 in FIG. 2A.

Specifically, as shown in FIGS. 2A and 2B or 2C, a central projecting part 2 protrudes from a position located at the center of the circle described by the disk-like heat treatment jig 1, and, for example, one circular-arc part 3 which is formed by cutting away a portion of a ring is disposed in an intermediate position with respect to the radius of the disk, so that this circular-arc part 3 is centered on the central projecting part 2. As shown in FIG. 2C, the central projecting part 2 may be slightly lower than the circular-arc part 3.

Figure 4A:
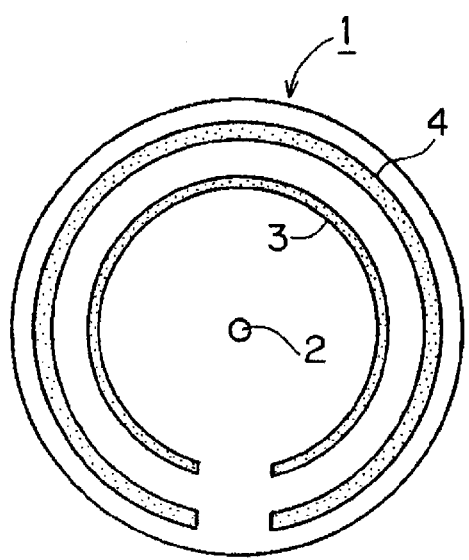
FIGS. 4A, 4B and 4C are explanatory plan views of other heat treatment jigs of the present invention.

Alternatively, as shown in FIG. 4A, one circular-arc part each may be disposed on two concentric circles of different radii, so that the heat treatment jig has a central projecting part 2 in the center of the disk-like heat treatment jig, and two circular-arc parts 3 and 4 that are disposed on concentric circles centered on this central projecting part 2.

Figure 4B:
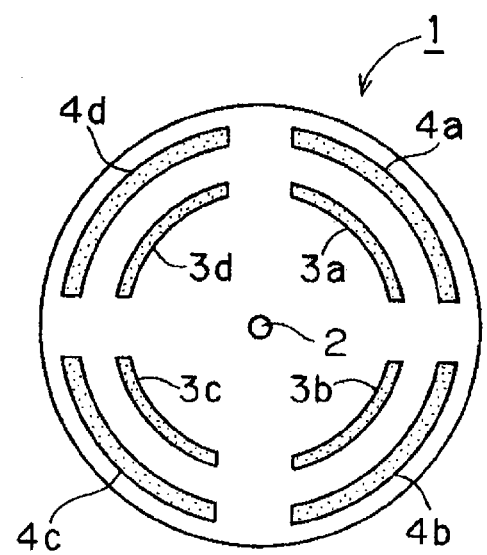

Furthermore, as shown in FIG. 4A, each of the two circular-arc parts 3 and 4 of different radii shown in the abovementioned FIG. 4B may be split into, for example, four parts, so that four circular-arc parts are disposed on the same concentric circle, and four circular-arc parts are similarly disposed on a concentric circle of a different radius, for a total of eight circular-arc parts 3a through 3d and 4a through 4d.

In order to allow the automatic placement of a silicon substrate w on the heat treatment jig 1 by means of tweezers T (FIG. 5A), the dimensions of the cut-out parts in the circular-arc parts 3 and 4, or the dimensions of the cut-out parts in the plurality of circular-arc parts 3a through 3d and 4a through 4d disposed on the same circles, are set so that these dimensions are greater than the width dimension of the abovementioned tweezers T used for transfer in all of the constructions shown in the abovementioned FIGS. 2A, 2B, 2C, 4A and 4B.

Furthermore, in order to allow the tweezers T to advance to a specified position on the heat treatment jig 1 and to be appropriately raised and lowered during automated transfer, as shown in FIGS. 2B and 2C, the height dimensions of the central projecting part 2 and circular-arc part 3 on the heat treatment jig 1 are set as dimensions that are at least greater than the thickness of the tweezers T used for transfer, so that these height dimensions are increased by an amount corresponding to the raising and lower space for the tweezers.

Figure 5A:
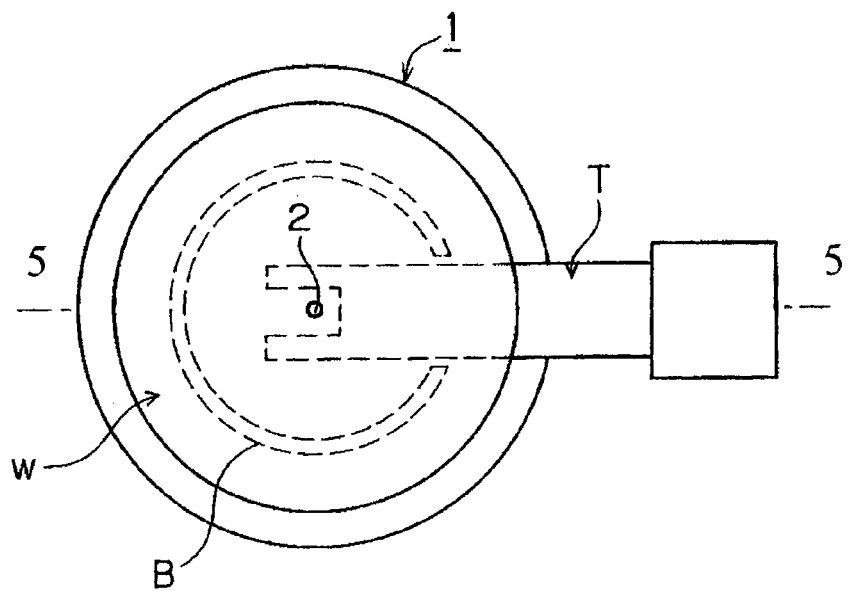
FIG. 5A is an explanatory plan view which shows the relationship between the heat treatment jig of the present invention and the tweezers during the transfer process.
Figure 5B:
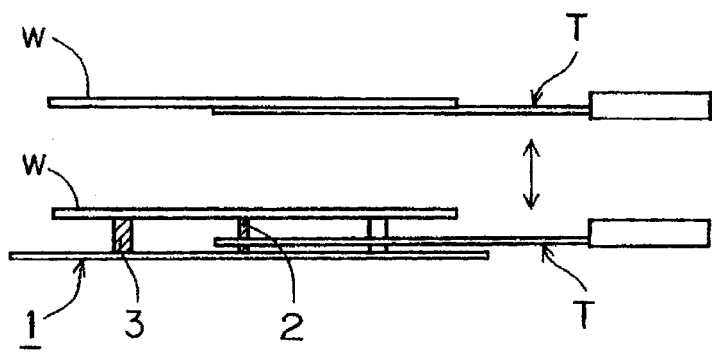
FIGS. 5B and 5C are explanatory diagrams of the tweezer transfer process as seen from the front, and are explanatory sectional views along line 5-5 in FIG. 5A.

Specifically, as shown in FIGS. 5A and 5B, the silicon substrate w carried on the transfer tweezers T is moved onto the heat treatment jig 1, and is then lowered so that this substrate is transferred onto the central projecting part 2 and circular-arc part 3, and since the central projecting part 2 and circular-arc part 3 have specified height dimensions, the transfer tweezers T can be pulled out from the space between the heat treatment jig 1 and silicon substrate w; furthermore, the silicon substrate w can be removed by performing these operations in reverse.

Figure 3A:
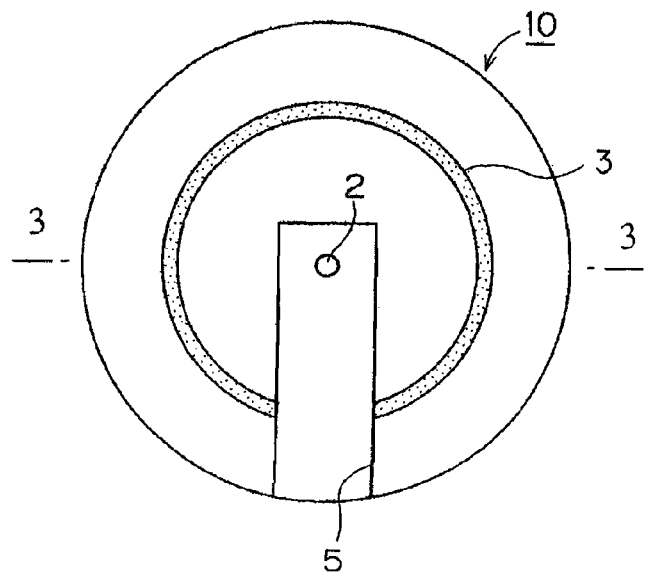
FIG. 3A is a plan view of another heat treatment jig of the present invention.
Figure 3B:
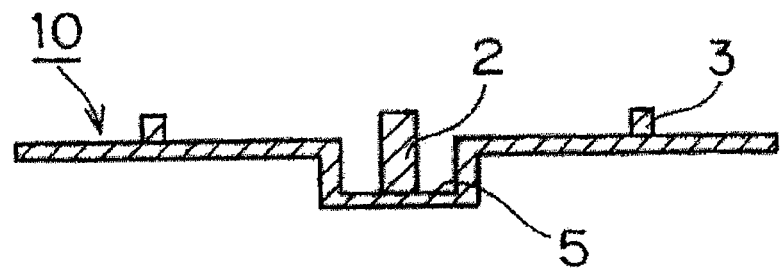
FIG. 3B is a sectional view along line 3-3 in FIG. 3A.
Figure 3C:
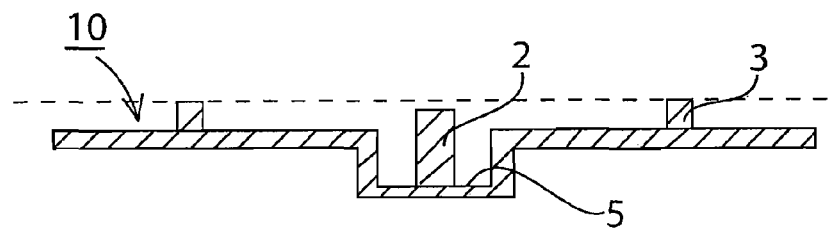
FIG. 3C is a sectional view of a different embodiment of the heat treatment jig of the present invention, cut along a line equivalent to line 3-3 in FIG. 3A.
Figure 4C:
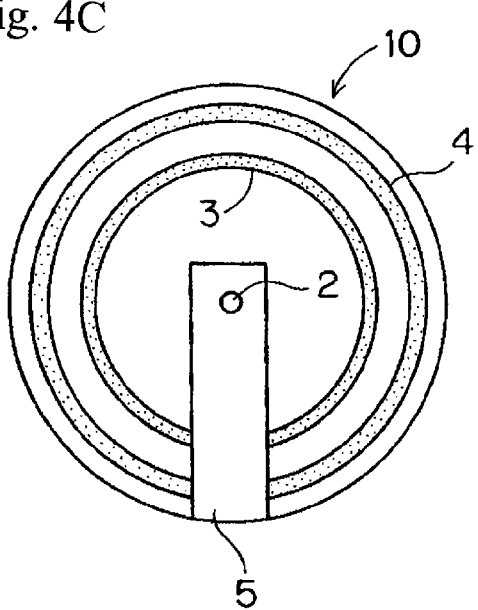

Furthermore, as shown in FIGS. 3A and 3B or 3C, a space which allows the transfer tweezers to enter and leave the space between the jig 10 and the silicon substrate carried on the jig 10, and to perform a specified raising and lowering motion, can be provided by forming a step-like groove part 5 (constituting a groove formed by forming a step) in the disk-like heat treatment jig 10 in the radial direction from the vicinity of the central projecting part 2. As shown in FIG. 3C, the central projecting part 2 may be slightly lower than the circular-arc part 3. Likewise, in the heat treatment jig 1 in which two circular-arc parts 3 and 4 of different radii are formed as shown in FIG. 4A, a step-like groove part 5 (constituting a groove formed by forming a step) can be similarly provided in the heat treatment jig 10 as shown in FIG. 4C.

Figure 5C:
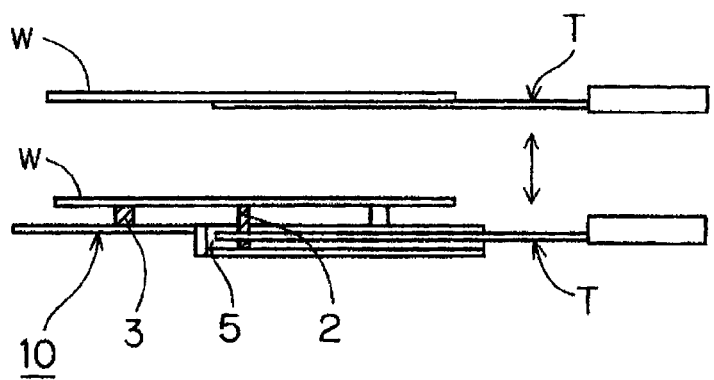

As shown in FIG. 5C, the silicon substrate w carried on the transfer tweezers T is moved onto the heat treatment jig 10 and then lowered so that this substrate is transferred onto the central projecting part 2 and circular-arc part 3, and since a step-like groove part 5 with a specified depth is formed, the transfer tweezers T can be pulled out of or inserted into this groove part 5.

In the present invention, besides the cross-sectional shape shown in FIGS. 2 through 5, the cross-sectional shape of the circular-arc parts can also be formed as a triangular cross-sectional shape as shown in FIGS. 6 and 7, so that an appropriate shape can be used. Furthermore, besides being manufactured as parts that protrude as integral parts of the material of the heat treatment jig that is used, these circular-arc parts and central projecting part can also be disposed by fastening constituent members of the circular-arc parts with various cross-sectional shapes to the surface of the disk-like heat treatment jig.

Figure 6A:
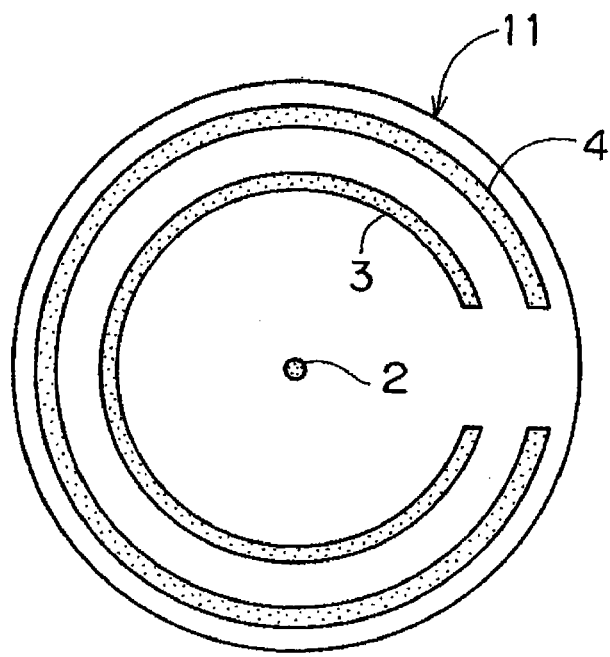
FIG. 6A is a plan view of other heat treatment jigs of the present invention.
Figure 6B:
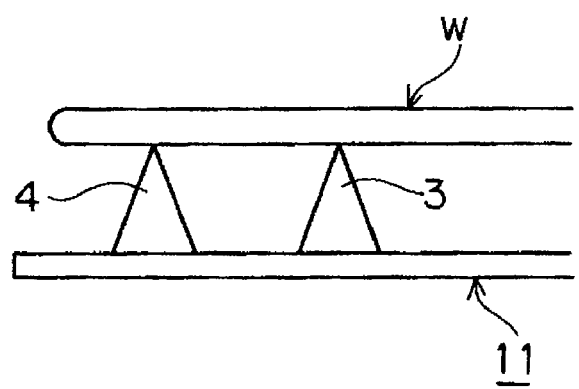
FIGS. 6B and 6C are sectional view of essential parts of FIG. 6A.
Figure 6C:
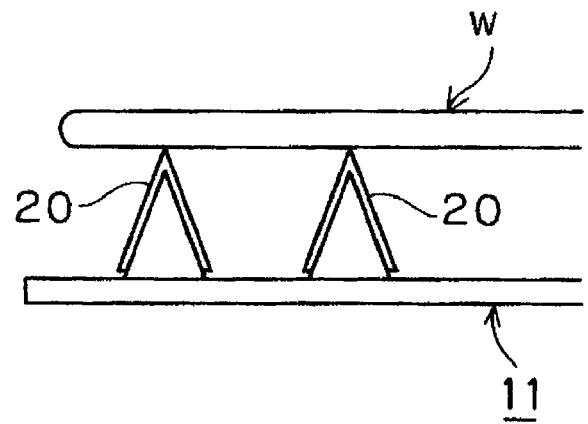

In the present invention, the heat treatment jig 11 may also have a construction in which capping members 20, 20 of the type shown in FIG. 6C are disposed on some or all of the contact surfaces of the central projecting part 2 and circular-arc parts 3 and 4 that contact the silicon substrate w. In cases where such capping members are disposed, the contact area with the silicon substrate w is small, so that there is little transfer of contaminants from the heat treatment jig 11. Furthermore, even if the capping members 20 are contaminated, these capping members can be replaced easily and inexpensively compared to cases where the entire jig 11 is replaced.

Figure 7A:
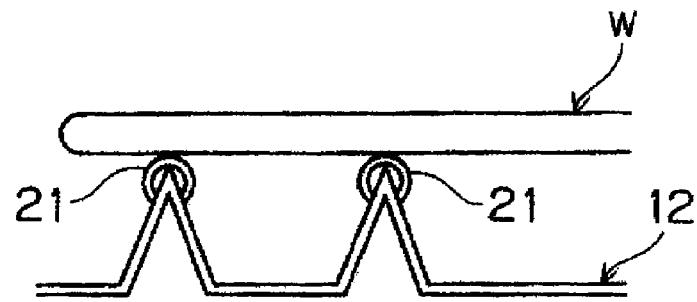
FIGS. 7A through 7E are explanatory sectional views of essential parts which show other heat treatment jigs of the present invention.
Figure 7B:
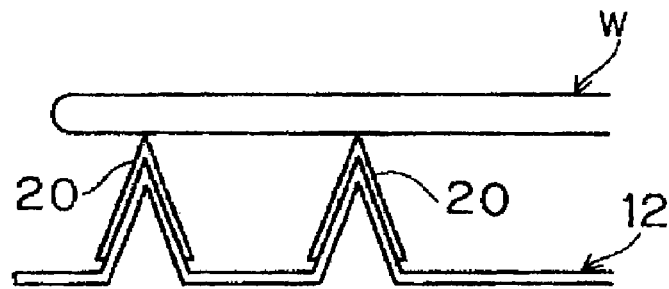
Figure 7C:
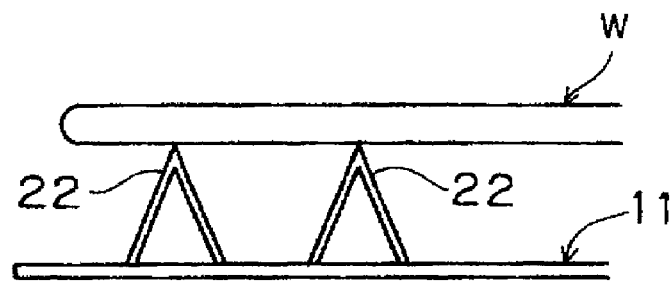
Figure 7D:
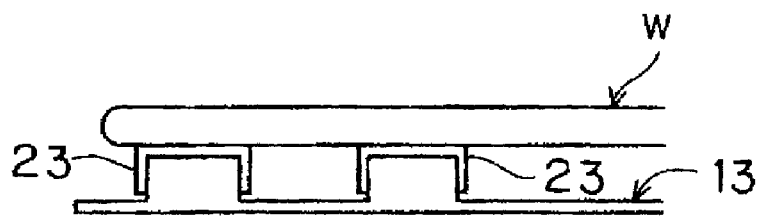

As shown in FIGS. 7A through 7C, the capping members 20, 21, 22 and 23 can be arbitrarily designed, i. e., constructed so as to cover all or part of the circular-arc parts in accordance with the cross-sectional shape of the circular-arc parts, and the thickness of these capping members can also be arbitrarily set. However, a small thickness is desirable in order to reduce the thermal capacity that is required, and a thickness of 0.2 mm to 5 mm is desirable if the manufacturing process is taken into account. Furthermore, in cases where capping members are disposed on the circular-arc parts but no capping member is disposed on the central projecting part, it is advisable to increase the height of the central projecting part by an amount corresponding to the thickness of the capping members.

Furthermore, materials such as quartz, silicon, ceramics, and glassy carbon that are used in silicon manufacturing processes can be employed as the material of the capping members; the material used may be appropriately selected in accordance with the abovementioned installation locations and shape.

Figure 7E:
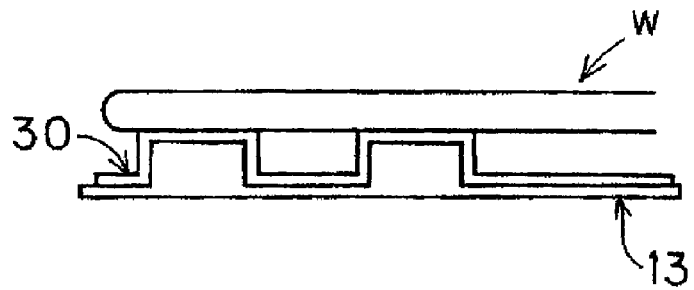

Furthermore, as shown in FIG. 7E, it would also be possible to use a construction of the heat treatment jig 13 in which at least a single layer of a coating film 30 is disposed on some or all of the contact surfaces of the central projecting part and circular-arc parts that contact the silicon substrate, instead of using capping members.

The material of such coating films may be silicon, a silicon oxide film or a silicon nitride film. However, since cracks may be generated in the coating films during the heat treatment process as a result of differences in the coefficient of thermal expansion in the case of coating films that consist of a different material than the matrix material of the heat treatment jig, it is desirable that the coating films have a thickness of approximately 1 mm to 20 mm. The effect that reduces slipping can be enhanced by subjecting the surfaces of the heat treatment jig, especially the surfaces of the central projecting part and circular-arc parts, to a polishing treatment prior to the formation of the abovementioned coating films.

Furthermore, in order to reduce the formation of abnormal grown projections (with a height of several microns to several tens of microns) on the surface of the silicon carbide, an intentional oxidation treatment is performed for 1 hour or longer in an oxygen atmosphere at a temperature of 1100° C. or higher. Subsequently, smoothing can be accomplished by repeating a series of procedures such as stripping (etching) with an aqueous solution of hydrofluoric acid or the like so that the abnormal grown projections are gradually consumed by oxidation.

Furthermore, since the oxidation rate decreases as the oxidation time increases, silicon carbide projections can be efficiently decreased by a procedure in which hydrofluoric acid cleaning is preferably repeated following a heat treatment for 1 to 4 hours at a temperature of 1150° C. to 1250° C.

In regard to other means, a smoothing effect on abnormal grown projections is also obtained in cases where grinding or a gas or solution that can etch silicon carbide (such as $CClF_3$ or the like) is applied, and a reduction in slipping may be similarly expected.

EMBODIMENTS

Comparative Example 1

Using a silicon substrate with a diameter of 200 mm that was grown by the Czokralsky method and treated up to the point of final polishing, this silicon substrate was placed in the conventional horseshoe-shaped silicon carbide heat treatment jig shown in FIG. 1A, and was subjected to a heat treatment for 1 hour at 1200° C. in an argon gas atmosphere. The wafer transfer method used was as follows: specifically, the horseshoe-shaped heat treatment jig was mounted in a boat for use in a vertical heat treatment furnace, and a silicon substrate accommodated in a transfer cassette was automatically transferred using tweezers. The transferred silicon substrate was observed using X-rays, and the conditions of slipping were checked.

Figure 1B:
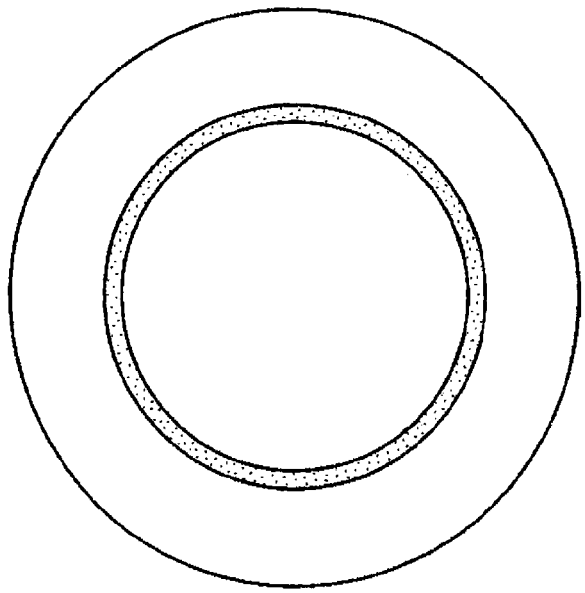
FIG. 1B shows a conventional complete ring type jig.

Similarly, the abovementioned heat treatment was also performed using the complete ring-shaped silicon carbide heat treatment jig shown in FIG. 1B. Since automatic transfer could not be performed, the method for transferring the wafer to the heat treatment jig was as follows: specifically, the heat treatment jig was removed from the boat beforehand; then, after the silicon substrate was mounted in the jig, the jig was manually set in the heat treatment boat. The transferred silicon substrate was observed using X-rays, and the conditions of slipping were checked.

Embodiment 1

Using the silicon carbide heat treatment jig of the present invention shown in FIG. 2, in which the heights of both the circular arc part and central projecting part were set at 5 mm, and the silicon carbide heat treatment jig of the present invention shown in FIG. 3, in which the circular arc height was set at 2 mm and the height of the central projecting part was set at 5 mm, these jigs were set in a heat treatment boat beforehand, the silicon substrate was automatically transferred, and a heat treatment similar to that performed in Comparative Example 1 was performed. The transferred silicon substrate was observed using X-rays, and the conditions of slipping were checked.

Embodiment 2

The heat treatment jig of Embodiment 1 of the present invention was subjected to a heat treatment for 4 hours at 1200° C. in a 100% oxygen atmosphere. Afterward, the oxidation film that was grown on the heat treatment jig was stripped away by means of an aqueous solution of hydrofluoric acid. After this operation was repeated three times, a heat treatment similar to that performed in Embodiment 1 was performed. The transferred silicon substrate was observed using X-rays, and the conditions of slipping were checked.

Embodiment 3

Using the silicon carbide jig of the present invention constructed as shown in FIGS. 6A and 6B, in which the heights of both the circular arc parts and the central projecting part were set at 5 mm, this jig was mounted in a heat treatment boat beforehand, the silicon substrate was automatically transferred, and a heat treatment similar to that performed in Comparative Example 1 was performed. The transferred silicon substrate was observed using X-rays, and the conditions of slipping were checked.

Embodiment 4

Using the heat treatment jig of Embodiment 3, the circular-arc parts were capped with rings made of quartz and silicon with thicknesses of 1 mm and 2 mm as shown in FIG. 6C. The resulting jigs were mounted beforehand in a heat treatment boat, the silicon substrate was automatically transferred, and a heat treatment similar to that performed in Comparative Example 1 was performed. The transferred silicon substrate was observed using X-rays, and the conditions of slipping were checked.

Embodiment 5

Silicon oxide films were deposited to respective thicknesses of 0.1 μm, 1 μm, 10 μm, 20 μm and 50 μm by a chemical deposition method on the surfaces of silicon carbide heat treatment jigs manufactured in the same manner and with the same precision as in Embodiment 3, and a heat treatment similar to that performed in Embodiment 3 was performed. The transferred silicon substrate was observed using X-rays, and the conditions of slipping were checked.

The observation results were as follows: specifically, in Comparative Example 1, conspicuous slipping occurred in the portions of the substrate that were carried on the cut parts of the horseshoe shape, while in the case of the complete ring shape, slipping of approximately 20 mm to 40 mm occurred in several places. In Embodiment 1, slipping of 8 mm to 30 mm was confirmed in portions of the circular-arc part regions in both types of heat treatment jigs used. In Embodiment 2, light slipping of approximately 5 mm to 15 mm occurred in the circular-arc parts. In Embodiment 3, slipping of 5 mm to 20 mm was confirmed in portions of the circular-arc part regions. In Embodiment 4, light slipping of approximately 5 mm was seen to a slight degree in portions of the circular-arc part regions. In Embodiment 5, there was a dependence on the coating film thickness, with slipping tending to decrease as the oxidation film thickness increased. At thicknesses of 10 μm or greater, a state that was free of any slipping was observed. However, even at a thickness of 0.1 μm, the occurrence of slipping was slight compared to Comparative Example 1.

MERITS OF THE INVENTION

In the present invention, as was clearly indicated in the embodiments, circular-arc parts which have cut-out parts wider than the width of the tweezers that transfer the silicon substrate are disposed on the jig, or a step-like groove part is formed by forming a step in the jig in the position where the tweezers will pass through. Accordingly, since there is no lowering of the synthesis of the jig itself, an increase in the diameter of the wafers being treated can be handled, so that automated transfer by means of tweezers can be accomplished while preventing slipping and dislocations due to the stress caused by the weight of the wafer itself, deflection of the heat treatment jig itself or the like.

The invention claimed is:

1. A heat treatment jig for a semiconductor silicon substrate comprising:
    a plate-like heat treatment jig that can carry a silicon substrate comprising:
        a central protrusion, provided at and over the center of the plate-like jig, for supporting a central portion of a backside of the substrate; and
        at least one circular-arc part for supporting the backside of the substrate; wherein the central projecting part is lower than the circular-arc part or parts such that stress caused by the substrate's own weight is efficiently dispersed.

* * * * *

UNITED STATES PATENT AND TRADEMARK OFFICE
CERTIFICATE OF CORRECTION

PATENT NO. : 7,442,038 B2
APPLICATION NO. : 11/463993
DATED : October 28, 2008
INVENTOR(S) : Naoshi Adachi It is certified that error appears in the above-identified patent and that said Letters Patent is hereby corrected as shown below:

On The Title Page, Item (73)

In the Assignee:

Please insert -- Sumitomo Mitsubishi Silicon Corporation --

Signed and Sealed this

Twenty-fourth Day of February, 2009

JOHN DOLL
*Acting Director of the United States Patent and Trademark Office*